United States Patent
Kumahara et al.

(10) Patent No.: US 6,982,919 B2
(45) Date of Patent: Jan. 3, 2006

(54) MEMORY CARD AND DATA PROCESSING SYSTEM

(75) Inventors: Chiaki Kumahara, Kodaira (JP); Atsushi Shikata, Higashiyamato (JP); Yasuhiro Nakamura, Tachikawa (JP); Hideo Kasai, Kokubunji (JP); Hidefumi Odate, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/891,297

(22) Filed: Jul. 15, 2004

(65) Prior Publication Data

US 2005/0041509 A1 Feb. 24, 2005

(30) Foreign Application Priority Data

Aug. 7, 2003 (JP) .................................... 2003-288407
Mar. 19, 2004 (JP) .................................... 2004-080593

(51) Int. Cl.
*G11C 7/08* (2006.01)

(52) U.S. Cl. .............. 365/226; 365/185.22; 365/185.23
(58) Field of Classification Search ................ 365/226, 365/185.22, 185.23, 185.33, 189.07, 230.06
See application file for complete search history.

(56) References Cited

U.S. PATENT DOCUMENTS 5,383,150 A * 1/1995 Nakamura et al. .......... 365/145
5,490,117 A    2/1996 Oda et al. ................... 365/226
5,828,892 A   10/1998 Mizuta .................... 395/750.01
6,032,221 A *  2/2000 Hongo ........................ 711/103
6,898,117 B2 * 5/2005 So et al. ................. 365/185.03
2003/0202383 A1 * 10/2003 Shiota et al. ........... 365/185.33

OTHER PUBLICATIONS

"The MultiMediaCard System Specification", Version 3.3, *MMCA Technical Committee*, Mar. 2003.

* cited by examiner

*Primary Examiner*—Van Thu Nguyen
*Assistant Examiner*—Dang T. Nguyen
(74) *Attorney, Agent, or Firm*—Miles & Stockbridge PC

(57) ABSTRACT

A memory card and a microcomputer with nonvolatile memory wherein operation under two different types of power supply specifications is achieved are provided.

A MultiMediaCard includes a flash memory and a controller which controls the operation associated with the flash memory. When the controller judges the level of supply voltage supplied from host equipment, it operates as follows: the controller judges whether detecting point corresponding to the voltage level of 1.8V system has been exceeded. After the judgment of excess, the controller judges whether detecting point corresponding to the voltage level of 3.3V system has been exceeded. When the supply voltage is at the voltage level of 1.8V system, the controller causes the flash memory to operate in the 1.8V-system operation mode without driving regulators or level shifters. When the supply voltage is at the voltage level of 3.3V system, the controller drives the regulators and the level shifters to convert the voltage level and causes the flash memory to operate in the 3.3V-system operation mode.

9 Claims, 12 Drawing Sheets

MEMORY CARD AND DATA PROCESSING SYSTEM

CROSS-REFERENCE TO RELATED APPLICATION

The present application claims priority from Japanese patent application JP 2003-288407 filed on Aug. 7, 2003, the content of which is hereby incorporated by reference into this application.

BACKGROUND OF THE INVENTION

The present invention relates to a memory card and a microcomputer with nonvolatile memory. More particularly, it relates to a technology which is effectively applied to a memory card equipped with a nonvolatile memory, such as flash memory (flash EEPROM) and a microcomputer with nonvolatile memory which is a combination of the nonvolatile memory and a microcomputer.

According to the present inventors' consideration, the following technologies are available with respect to memory card.

As external storage media for personal computers and portable devices, memory cards, such as MultiMediaCard (registered trademark) standardized by MMCA (MultiMediaCard Association), standardized by MMCA (MultiMediaCard Association), a standardization organization, have been widely known. The memory cards are used for recording still-frame images in digital video cameras, data in cellular phones, and pieces of music in music players and for other purposes. With respect to MultiMediaCard, for example, Non-patent Document 1 drawn up by MMCA lays down power supply specifications. According to the document, the power supply for MultiMediaCard is standardized as 1.8V system ($1.65V \leq Vcc \leq 1.95V$) and 3.3V system ($2.70V \leq Vcc \leq 3.60V$). At the same time the range of voltage between 1.95V and 2.70V ($1.95V < Vcc < 2.70V$) is taken as inhibition region.

[Non-patent Document 1] MultiMediaCard System Specification Version 3.3

SUMMARY OF THE INVENTION

The present inventors considered technologies for the above-mentioned memory card, and as a result, found the following:

For example, with respect to MultiMediaCard mentioned above, the power supply specification is standardized as 1.8V system and 3.3V system. Under the present circumstances, those which operate on a power supply of 3.3V system have been commercialized. In this situation, portable devices using MultiMediaCard tend to be reduced in power consumption. As a result, it is desired that MultiMediaCard is shifted from 3.3V system to 1.8V system as required and operated on power supply of 1.8V system.

Consequently, the object of the present invention is to provide a memory card and a microcomputer with nonvolatile memory capable of operating under two different types of power supply specifications, for example, 1.8V system and 3.3V system.

The above and further objects and novel features of the present invention will be apparent from the description in this specification and the accompanying drawings.

The following is a brief description of the gist of the representative elements of the invention laid open in this application.

The present invention is applied to a memory card comprising: a nonvolatile memory (e.g. flash memory); a controlling means (e.g. controller) for controlling the operation associated with the nonvolatile memory; and converting means (e.g. regulator/level shifter) which converts voltage level in correspondence with the operation of the nonvolatile memory. The memory card is provided with first operation mode in which the nonvolatile memory is caused to operate at a first voltage level and second operation mode in which the nonvolatile memory is caused to operate at a second voltage level higher than the first voltage level. When the controlling means judges the level of supply voltage, it operates as follows: after the judgment of excess of a first detecting point corresponding to the first voltage level, it judges whether a second detecting point corresponding to the second voltage level has been exceeded. When the supply voltage is at the first voltage level, the controlling means causes the nonvolatile memory to operate in the first operation mode without driving the converting means. When the supply voltage is at the second voltage level, the controlling means drives the converting means to covert the voltage level, and causes the nonvolatile memory to operate in the second operation mode.

In this memory card, the controlling means has information indicating that the memory card is operable at either or both of the first voltage level and the second voltage level. The controlling means automatically carries out transition from the first operation mode to the second operation mode. It disables transition from the second operation mode to the first operation mode or enables it when it receives a transition instruction from host equipment. Especially, 1.8V system is taken for the first voltage level, and 3.3V system is taken for the second voltage level.

Further, the present invention is applied to a microcomputer with nonvolatile memory, and the microcomputer comprises a nonvolatile memory (e.g. flash memory), a microcomputer, and converting means (e.g. regulator/level shifter) each having the same functions as the similar elements in the above-mentioned memory card. When the microcomputer judges the level of supply voltage, it operates as follows: after the judgment of excess of a first detecting point corresponding to the first voltage level, it judges whether a second detecting point corresponding to the second voltage level has been exceeded. When the supply voltage is at the first voltage level, the microcomputer causes the nonvolatile memory to operate in the first operation mode without driving the converting means. When the supply voltage is at the second voltage level, the microcomputer drives the converting means to convert the voltage level, and causes the nonvolatile memory to operate in the second operation mode.

In this microcomputer with nonvolatile memory, the microcomputer has information indicating that the microcomputer with nonvolatile memory is operable at either or both of the first voltage level and the second voltage level. The microcomputer automatically carries out transition from the first operation mode to the second operation mode and transition from the second operation mode to the first operation mode. Especially, 1.8V system is taken for the first voltage level, and 3.3V system is taken for the second voltage level.

The following is a brief description of the gist of effects brought about by the representative elements of the invention laid open in this application.

(1) Operation under two different types of power supply specifications for first voltage level and second voltage level, for example, 1.8V system and 3.3V system, can be implemented.

(2) According to (1) above, a memory card and a microcomputer with nonvolatile memory operable at two different voltage levels for which power supply specifications are different can be provided.

DETAILED DESCRIPTION OF THE PREFERRED EMBODIMENTS

Figure 1:
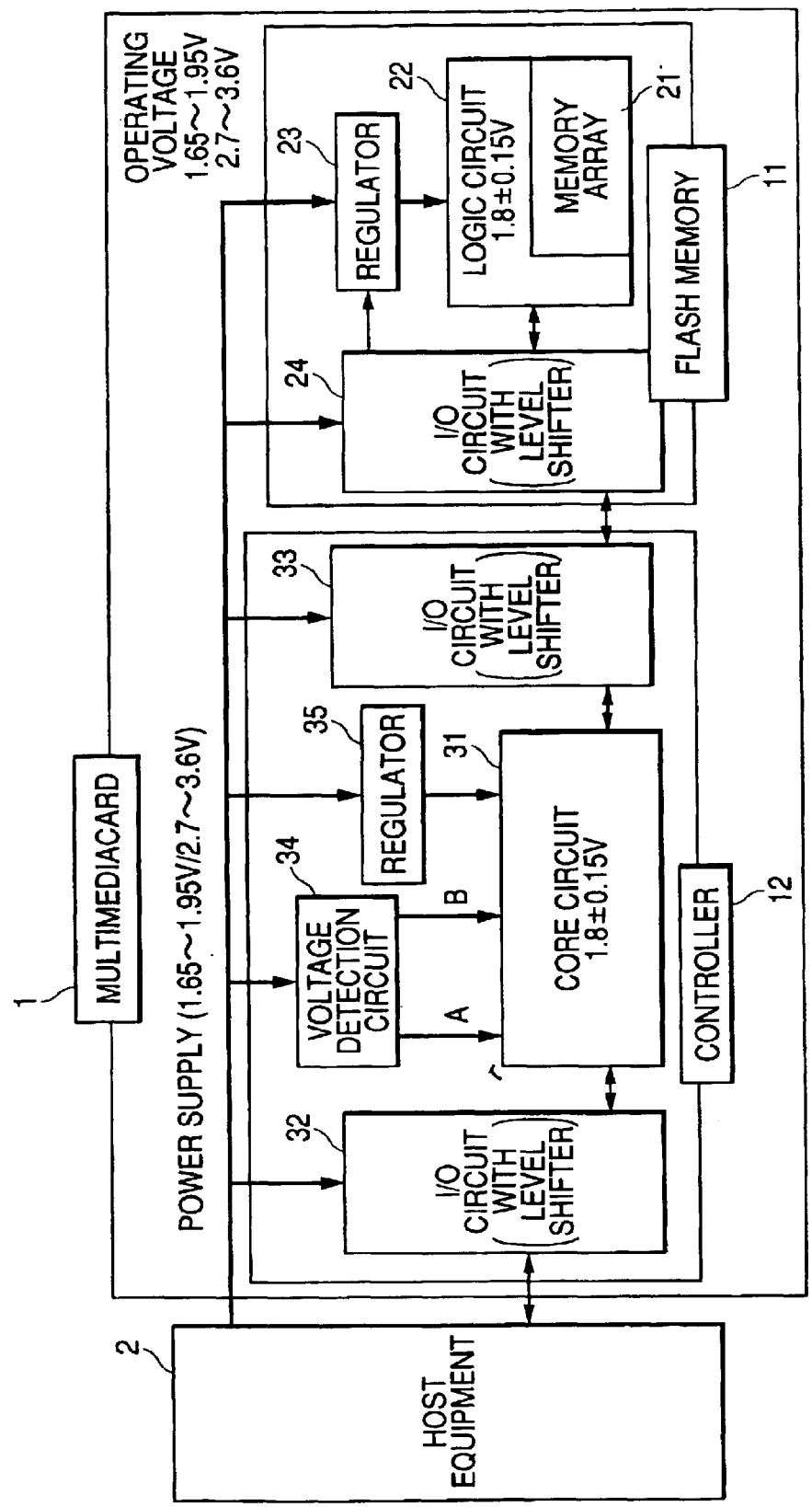
FIG. 1 is a schematic diagram illustrating a system using a memory card in an embodiment of the present invention.

The embodiments of the present invention will be described in detail below referring to the drawings. In the drawings for the description of the embodiments, members having the same function will be provided with the same reference numbers, and the repetitive description thereof will be omitted.

First, referring to FIG. 1, description will be given to an example of the configuration of a system using a memory card in an embodiment of the present invention. FIG. 1 is a schematic diagram of the system using the memory card.

The system using the memory card in this embodiment is constituted as a system using, for example, MultiMediaCard as an example of memory card. The system comprises: a MultiMediaCard 1; host equipment 2 which is electrically connected with the MultiMediaCard 1 and supplies the MultiMediaCard 1 with commands to control the operation of the MultiMediaCard 1; and the like. In this system, the host equipment 2 comprises, for example, a personal computer, a portable device, or the like, and the MultiMediaCard 1 is used as an external storage medium therefor.

The MultiMediaCard 1 comprises a flash memory 11 for storing varied information, a controller 12 which controls the operation associated with the flash memory 11, and the like. The MultiMediaCard 1 is withdrawably installed in the host equipment 2, and is electrically connected with the host equipment 2 when inserted in the host equipment 2.

The flash memory 11 comprises: a memory array 21 for storing user data, management data, and the like; a logic circuit 22 having the functions of controlling the memory array 21 and performing logical operation related thereto; a regulator 23 provided with turn-on/off function for converting the voltage level at which a core circuit comprising the memory array 21 and the logic circuit 22 is caused to operate; an I/O circuit 24 which is responsible for interface with the controller 12 and has the functions of controlling a level shifter provided with turn-on/off function and the like and performing logical operation related thereto, for connection with the controller 12; and the like.

The controller 12 comprises: a core circuit 31 comprising CPU responsible for computation for the entire card and the like; an I/O circuit 32 which is responsible for interface with the host equipment 2 and has the functions of controlling a level shifter provided with turn-on/off function and the like and performing logical operation related thereto, for connection with the host equipment 2; an I/O circuit 33 which is responsible for interface with the flash memory 11 and has the functions of controlling a level shifter provided with turn-on/off function and the like and performing logical operation related thereto, for accessing the flash memory 11; a voltage detection circuit 34 which detects the level of supply voltage supplied from the host equipment 2; a regulator 35 provided with turn-on/off function for converting the voltage level at which the core circuit 31 is caused to operate; and the like. Further, the controller 12 has in the register (not shown) in the core circuit 31 information indicating that the memory card is operable at both of the first voltage level of 1.8V system and the second voltage level of 3.3V system. When the supply voltage at which the memory card is operable is limited to either 1.8V system or 3.3V system, the controller 12 may have information indicating that the memory card is operable at that voltage.

In the system constituted as mentioned above, the MultiMediaCard 1 is supplied from the host equipment 2 with voltages of 1.8V system (1.65V to 1.95V) and of 3.3V system (2.7 to 3.6V) as supply voltage. Then, the voltage is applied to the flash memory 11 and the controller 12.

In the flash memory 11, the following operation takes place depending on supply voltage: when voltage of 1.8V system is applied, the regulator 23 is turned off and is not driven. When voltage of 3.3V system is applied, the regulator 23 is turned on to convert the voltage level into 1.8V system. Thus, a voltage of 1.8V±0.15V is applied to the core circuit comprising the memory array 21 and the logic circuit 22. Further, in the I/O circuit 24, the similar operation takes place depending on supply voltage: when voltage of 1.8V system is applied, the level shifter is turned off and is not driven. When voltage of 3.3V system is applied, the level shifter is turned on to convert the signal amplitude into that corresponding to the voltage level of 1.8V system.

In the controller 12, meanwhile, the following operation takes place: when voltage of 1.8V system is applied and when voltage of 3.3V system is applied as well, the regulator 35 is turned on to constantly convert the voltage level into 1.8V system. Thus, a voltage of 1.8V±0.15V is applied to the core circuit 31. Further, in the I/O circuit 32, the following operation takes place depending on supply voltage: when voltage of 1.8V system is applied, the level shifter is turned off and is not driven. When voltage of 3.3V system is applied, the level shifter is turned on to convert the signal amplitude into that corresponding to the voltage level of 1.8V system.

At this time, the turn-on and -off of the regulator 23 in the flash memory 11, the regulator 35 in the controller 12, and the level shifters are controlled as follows: the supply voltage from the host equipment 2 is detected through the voltage detection circuit 34, and the above control is carried out based on the result of judgment in the core circuit 31. For example, the level of the supply voltage is judged as follows: it is judged whether detecting point A (1.25V to 1.55V) corresponding to the voltage level of 1.8V system has been exceeded. After the judgment of excess, it is judged whether detecting point B (2.3V to 2.5V) corresponding to the voltage level of 3.3V system has been exceeded. When the supply voltage is at the voltage level of 1.8V system, the regulator 23 or each level shifter is not driven, and the flash memory 11 is caused to operate in the 1.8V-system operation mode. When the supply voltage is at the voltage level of 3.3V system, the regulator 23 and the level shifters are driven to convert the voltage level, and the flash memory 11 is caused to operate in the 3.3V-system operation mode. Thus, the memory card can be operated in two different operation modes, different in voltage level, 1.8V system and 3.3V system.

The core circuit 31 in the controller 12 can be similarly operated: at the voltage level of 1.8V system, the core circuit 31 can be operated in the 1.8V-system operation mode without driving the level shifters. At the voltage level of 3.3V system, the core circuit 31 can be operated in the 3.3V-system operation mode by driving the level shifters to convert the voltage level.

Figure 2:
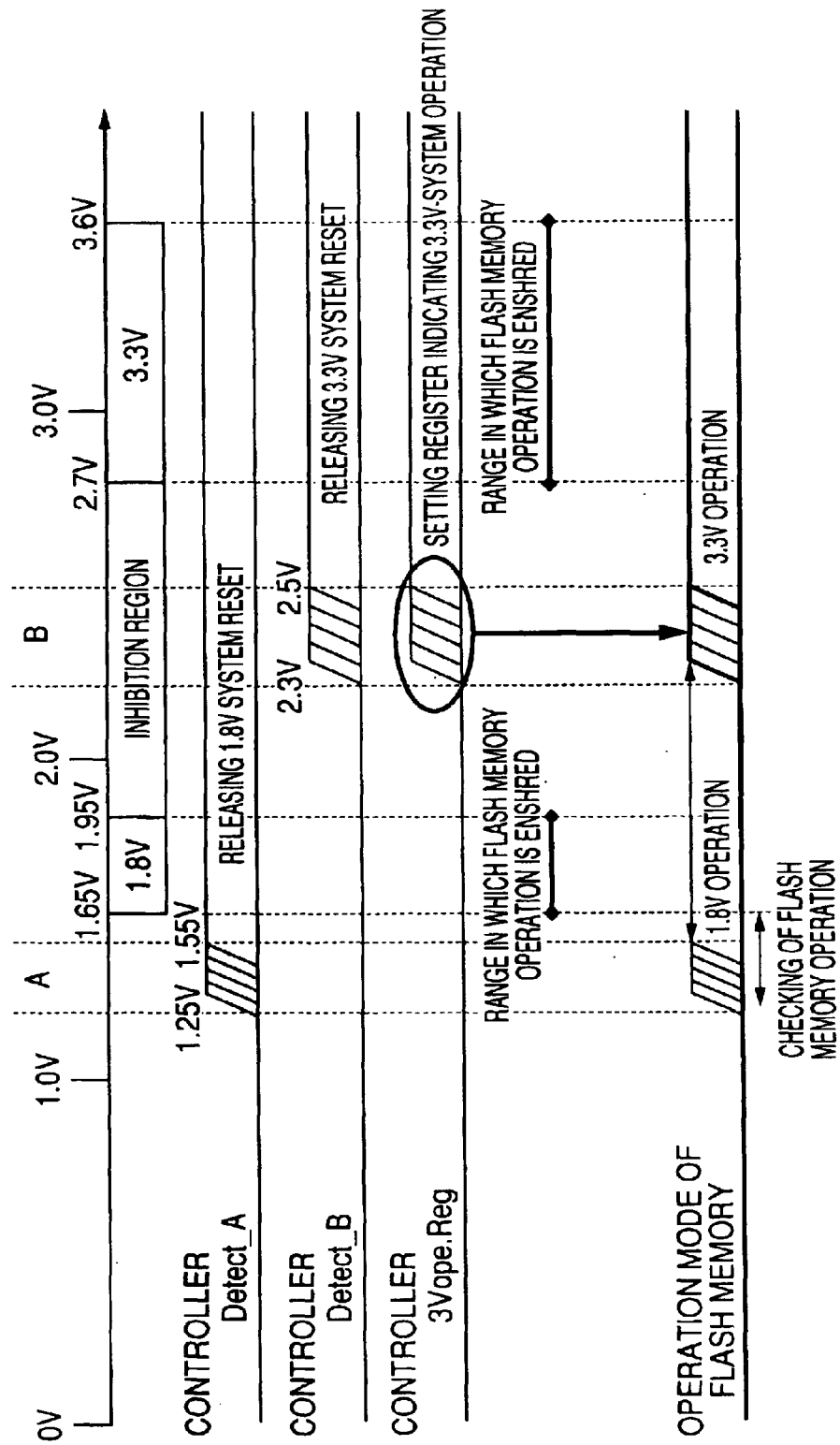
FIG. 2 is an explanatory drawing illustrating the power-on sequence in a system using a memory card in an embodiment of the present invention.

Next, referring to FIG. 2, description will be given to an example of the power-on sequence of a system using a memory card in this embodiment. FIG. 2 is an explanatory drawing of the power-on sequence. In this system, the host equipment 2 is notified beforehand of voltage ranges in which the MultiMediaCard 1 is operable.

In the power-on sequence, after detecting point A (1.25V to 1.55V) is exceeded, the MultiMediaCard 1 is brought into the 1.8V-system (1.65V to 1.95V) operation mode. More specific description will be given. When the voltage level within the range of 1.25V to 1.55V is detected through the voltage detection circuit 34 (Detect_A), in response thereto, the core circuit 31 releases resetting of the 1.8V-system operation mode. Thus, the flash memory 11 is caused to operate within the range of 1.65V to 1.95V in which the flash memory operation is ensured. Within the range of 1.25V to 1.65V including detecting point A, read operation is performed on the flash memory 11 under the control of the controller 12 to check the operation of the flash memory 11.

Further, after detecting point B (2.7 to 3.6V) is exceeded, the controller 12 instructs the flash memory 11 to operate in the 3.3V-system (2.7 to 3.6V) operation mode. As a result, the flash memory 11 is brought into the 3.3V-system operation mode. More specific description will be given. When the voltage level within the range of 2.7V to 3.6V is detected through the voltage detection circuit 34 (Detect_B), in response thereto, the core circuit 31 releases resetting of the 3.3V-system operation mode. Thus, the flash memory 11 is caused to operate within the range of 2.7V to 3.6V in which the flash memory operation is ensured. At this time, the register (3Vope.Reg) for indicating the 3.3V-system operation, built in the controller 12, is set, and the operation mode is specified by a command.

Figure 3:
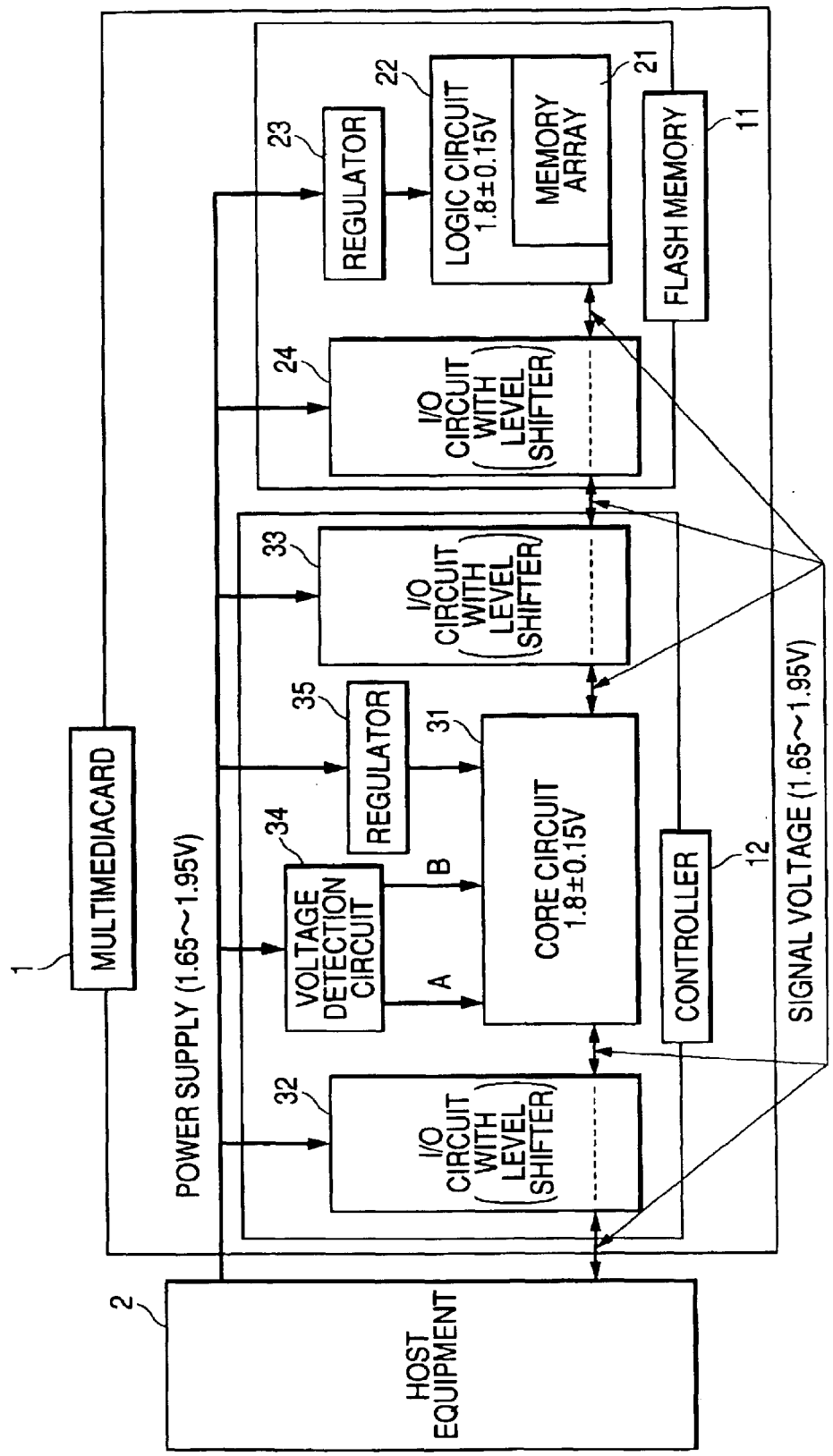
FIG. 3 is an explanatory drawing illustrating the operation of a system using a memory card in an embodiment of the present invention when detecting point A is exceeded.
Figure 4:
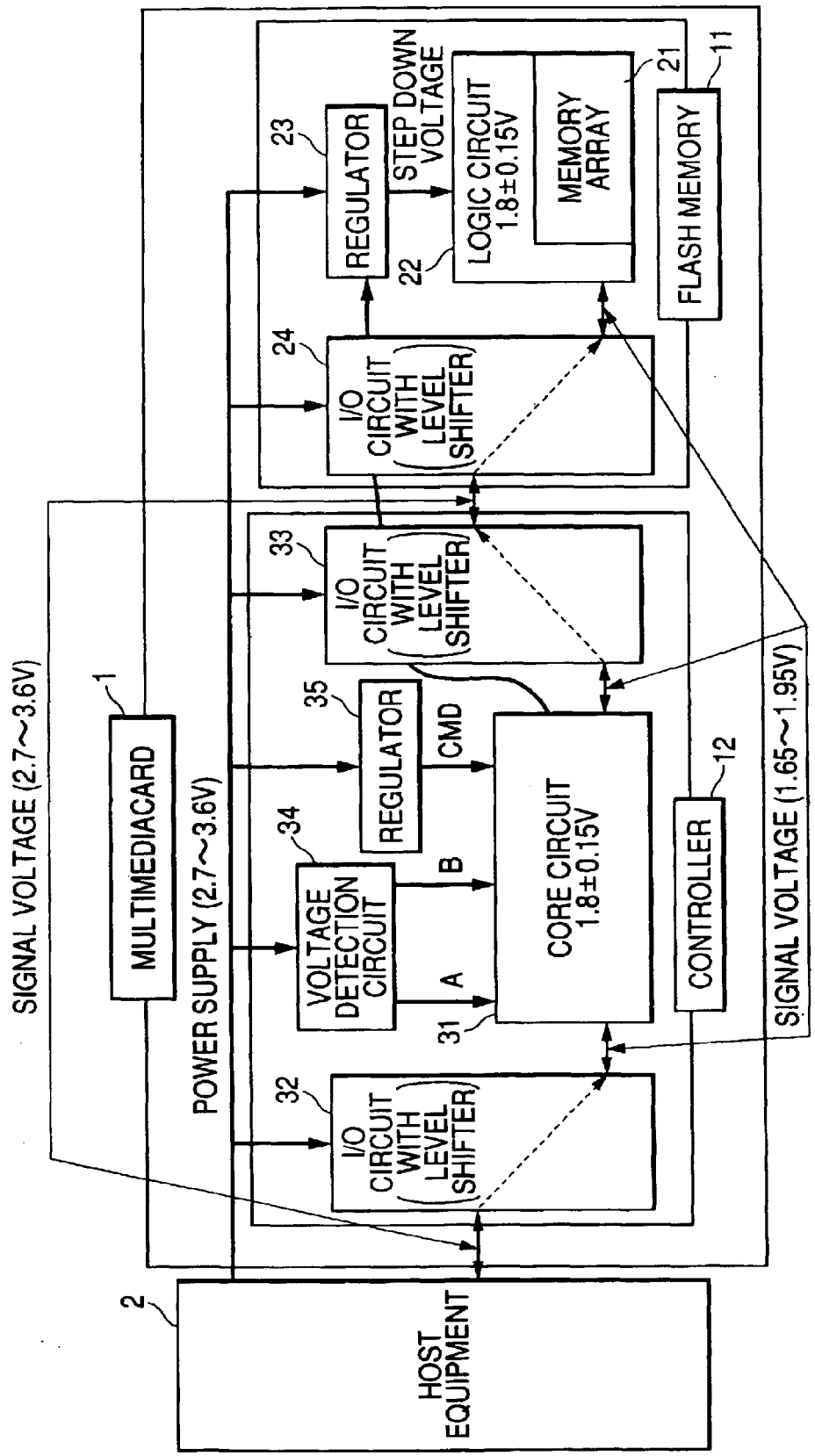
FIG. 4 is an explanatory drawing illustrating the operation of a system using a memory card in an embodiment of the present invention when detecting point B is exceeded (with level shifters provided).
Figure 5:
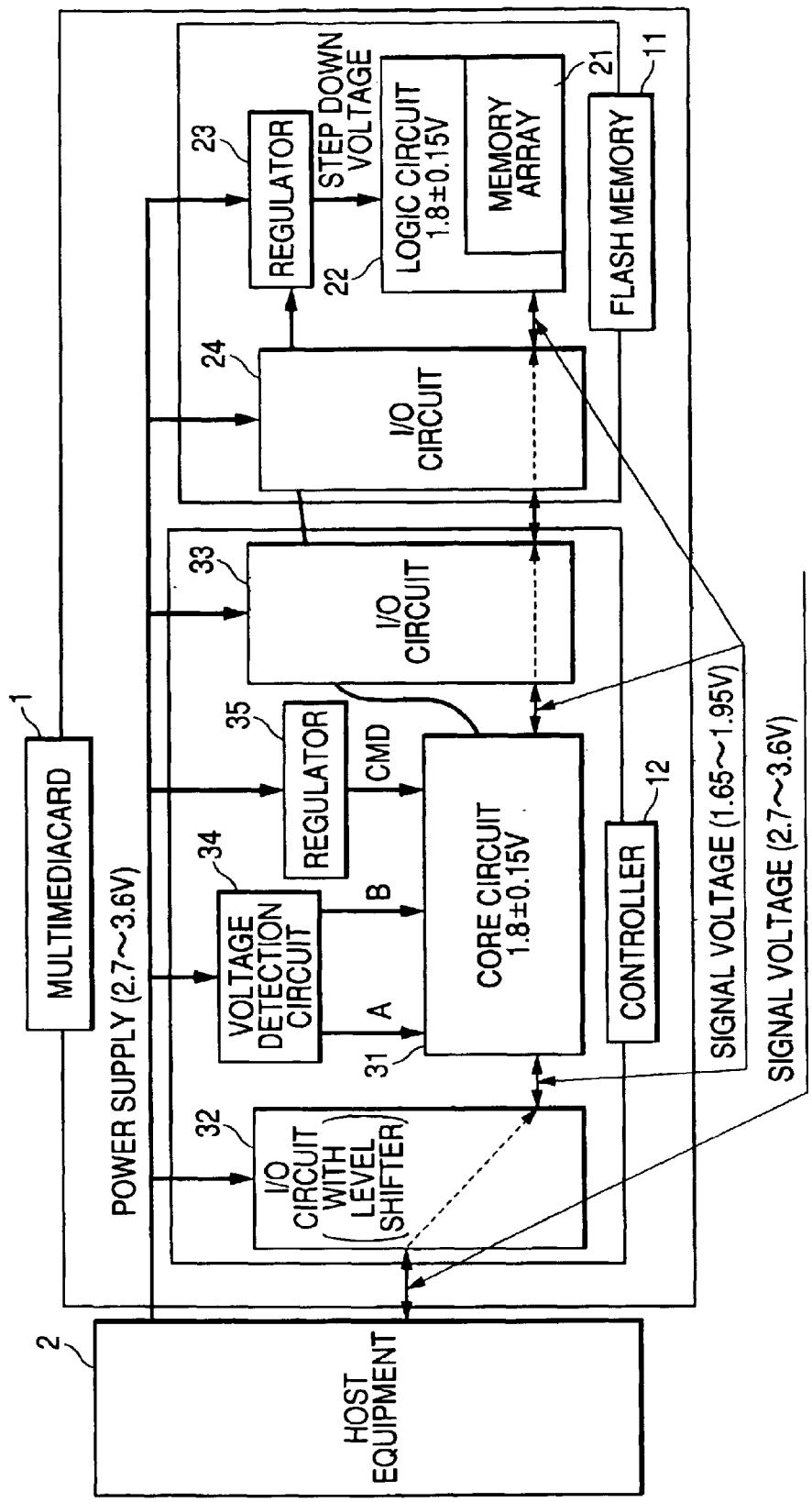
FIG. 5 is an explanatory drawing illustrating the operation of a system using a memory card in an embodiment of the present invention when detecting point B is exceeded (with level shifters not provided).
Figure 6:
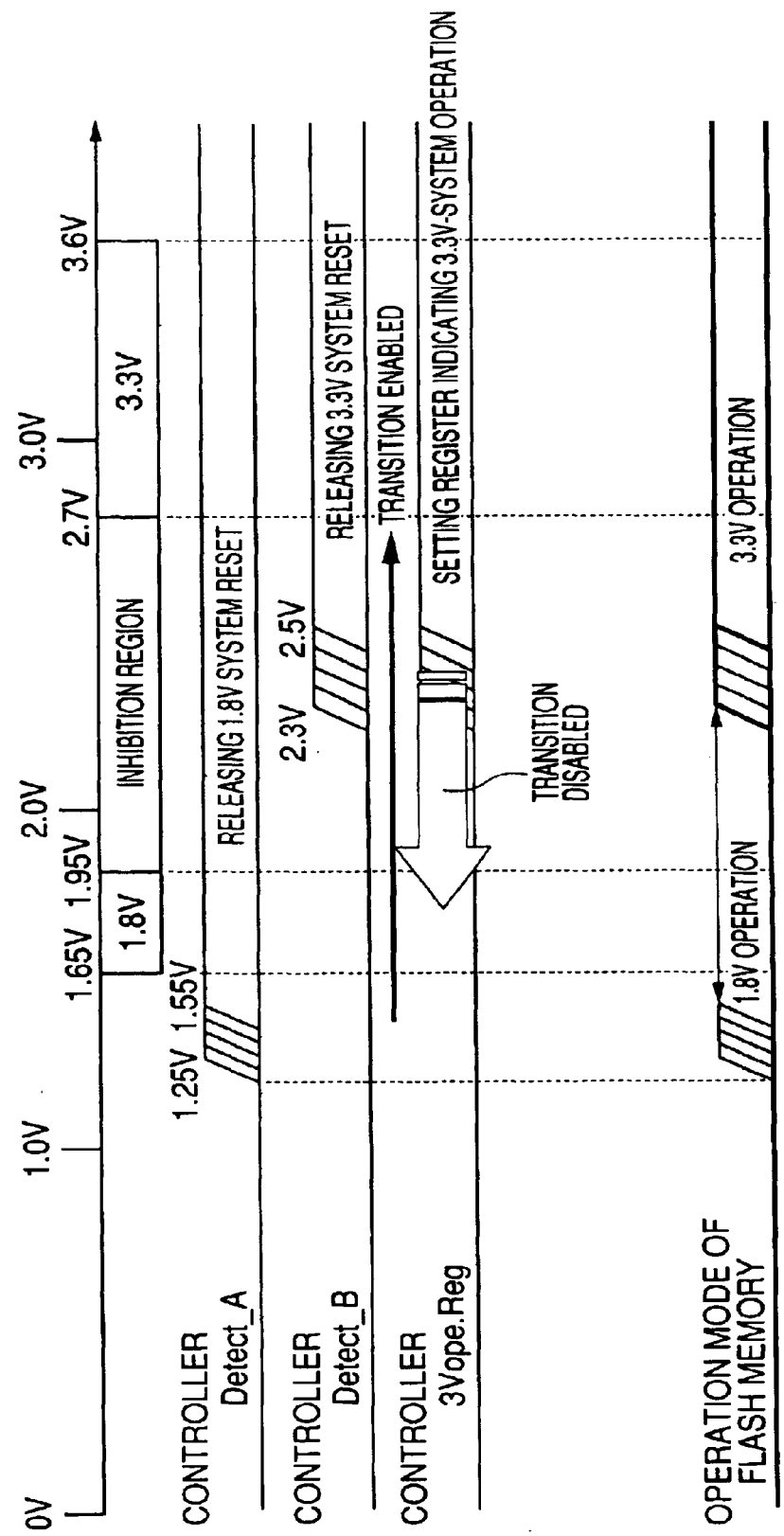
FIG. 6 is an explanatory drawing illustrating the operation of a system using a memory card in an embodiment of the present invention which takes place when the supply voltage drops to detecting point B or below after detecting point B is exceeded (transition disabled).
Figure 7:
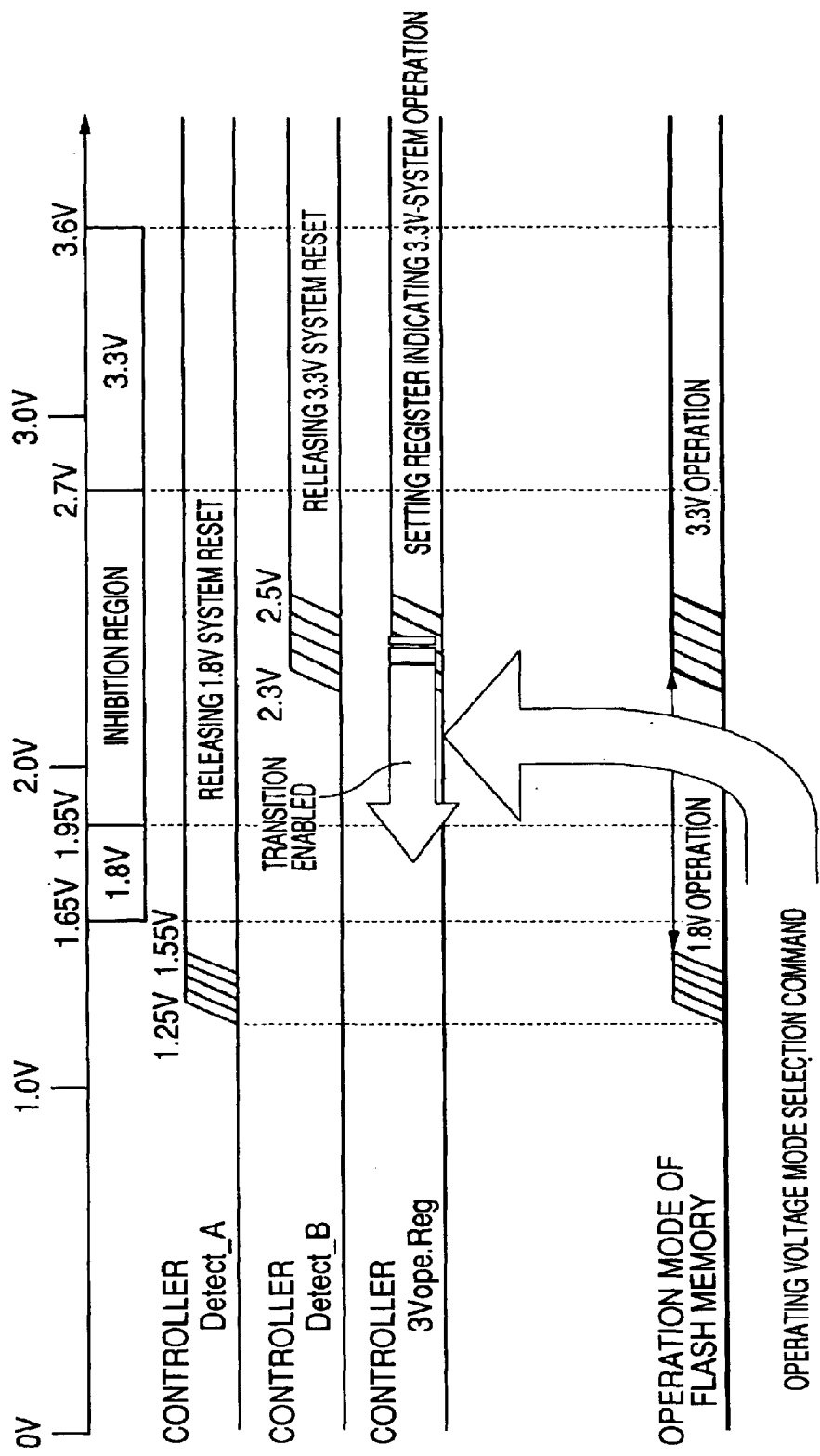
FIG. 7 is an explanatory drawing illustrating the operation of a system using a memory card in an embodiment of the present invention which takes place when the supply voltage drops to detecting point B or below after detecting point B is exceeded (transition enabled).

Next, referring to FIG. 3 to FIG. 7, description will be given to the operation of MultiMediaCard at each detecting point. FIG. 3 is an explanatory drawing illustrating the operation which takes place when detecting point A is exceeded. FIG. 4 is an explanatory drawing illustrating the operation which takes place when detecting point B is exceeded (with level shifters provided). FIG. 5 is an explanatory drawing illustrating the operation which takes place when detecting point B is exceeded (with level shifters not provided). FIG. 6 is an explanatory drawing illustrating the operation which takes place when detecting point B is exceeded and then the supply voltage drops to detecting point B or below (transition disabled). FIG. 7 is an explanatory drawing illustrating the operation which takes place when detecting point B is exceeded and then the supply voltage drops to detecting point B or below (transition enabled).

As illustrated in FIG. 3, when the supply voltage from the host equipment 2 exceeds detecting point A, the operating voltages of the core circuit 31 in the controller 12 and the core circuit in the flash memory 11 are equal to the supply voltage from the host equipment 2. Therefore, the level shifters of the I/O circuits 32 and 33 in the controller 12 and of the I/O circuit 24 in the flash memory 11 are turned off and are not driven. Also, the regulator 23 in the flash memory 11 is turned off and is not driven. That is, both the core circuit 31 of the controller 12 and the core circuit of the flash memory 11 in the MultiMediaCard 1 are caused to operate on the supply voltage (1.8V system:1.65V to 1.95V) from the host equipment 2. At the same time, the signal voltages between the host equipment 2 and the core circuit 31 of the controller 12 in the MultiMediaCard 1 and between the core circuit 31 of the controller 12 and the core circuit of the flash memory 11 are inputted and outputted as 1.8V-system voltages. Thus, the flash memory 11 can be operated in the 1.8V-system operation mode.

As illustrated in FIG. 4, when the supply voltage from the host equipment 2 exceeds detecting point B, the operating voltages of the core circuit 31 of the controller 12 and the core circuit of the flash memory 11 are different from the supply voltage from the host equipment 2. Therefore, the level shifters of the I/O circuits 32 and 33 in the controller 12 and of the I/O circuit 24 in the flash memory 11 are turned on to equalize the signal levels. More specific description will be given. The I/O circuit 32 between the host equipment 2 and the controller 12 in the MultiMediaCard 1 lowers the voltage from 3.3V system to 1.8V system. The I/O circuit 33 between the controller 12 and the flash memory 11 increases the voltage from 1.8V system to 3.3V system. The I/O circuit 24 of the flash memory 11 lowers the voltage from 3.3V system to 1.8V system. At the same time, the regulator 23 refers to the register (3Vope.Reg) for indicating the 3.3V-system operation in the controller 12, and issues a 3.3V-system operation command (CMD) to the flash memory 11. Thereby, the regulator 23 lowers the voltage from 3.3V system to 1.8V system. Thus, the core circuit 31 of the controller 12 and the core circuit of the flash memory 11 in the MultiMediaCard 1 are caused to operate on the 1.8V-system voltage. Consequently, the operation mode automatically transits from the 1.8V-system operation mode to the 3.3V-system operation mode, and the flash memory 11 can be operated in the 3.3V-system operation mode.

While FIG. 4 illustrates a constitution wherein the level shifters exist in the I/O circuits between the controller 12 and the flash memory 11, FIG. 5 illustrates a constitution wherein the level shifters do not exist. With the constitution in FIG. 5, the I/O circuits 33 and 24 between the controller 12 and the flash memory 11 can be driven with the 1.8V-system voltage maintained.

A system may be provided with such a mechanism as illustrated in FIG. 6. The mechanism is on the assumption that the electric power may lower on the host equipment 2 side. When the supply voltage from the host equipment 2 exceeds detecting point B and then drops to detecting point B or below, the mechanism prevents the MultiMediaCard 1 from transiting from the 3.3V-system operation to the 1.8V-system operation. That is, when the setting of the register (3Vope.Reg) for indicating the 3.3V-system operation in the controller 12 changes from "1" to "0," the MultiMediaCard 1 transits into inactive state. Thus, while transition from the 1.8V-system operation mode to the 3.3V system operation mode can be automatically carried out, transition from the 3.3V system operation mode to the 1.8V-system operation mode can be disabled.

While FIG. 6 illustrates the mechanism for disabling transition from the 3.3V-system operation mode to the 1.8V-system operation mode, FIG. 7 illustrates the following mechanism: the mechanism is on the assumption that low-power mode is requested from the host equipment 2 operating on the 3.3V-system voltage. Under the mechanism, on receipt of a command (operating voltage mode selection command) from the host equipment 2, the MultiMediaCard 1 can transit to the 1.8V-system operation. At this time, the supply voltage exceeds detecting point B and thereafter drops to detecting point B or below. To cope with this, a flag for operating voltage mode selection command is set. Thus, the MultiMediaCard 1 transits to active state even when the setting of the register (3Vope.Reg) for indicating the 3.3V-system operation in the controller 12 changes from "1" to "0." At this time, the regulator 23 of the flash memory 11 is turned off to operate the flash memory 11 in the 1.8V-system operation mode as well. Thus, transition from the 3.3V-system operation mode to the 1.8V-system operation mode can be carried out according to a command from the host equipment 2.

Figure 8:
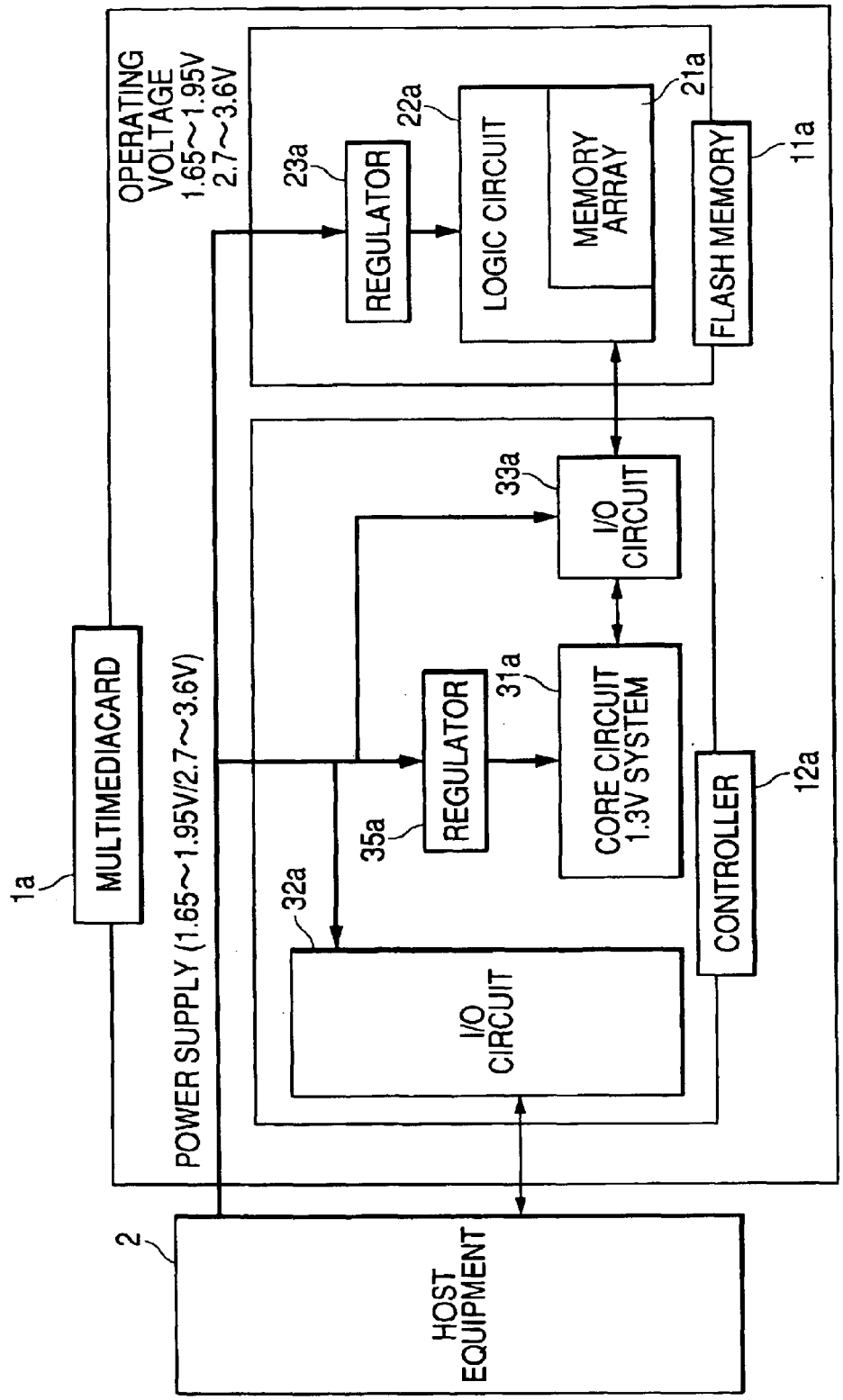
FIG. 8 is a schematic diagram illustrating a system using another memory card in an embodiment of the present invention.
Figure 9:
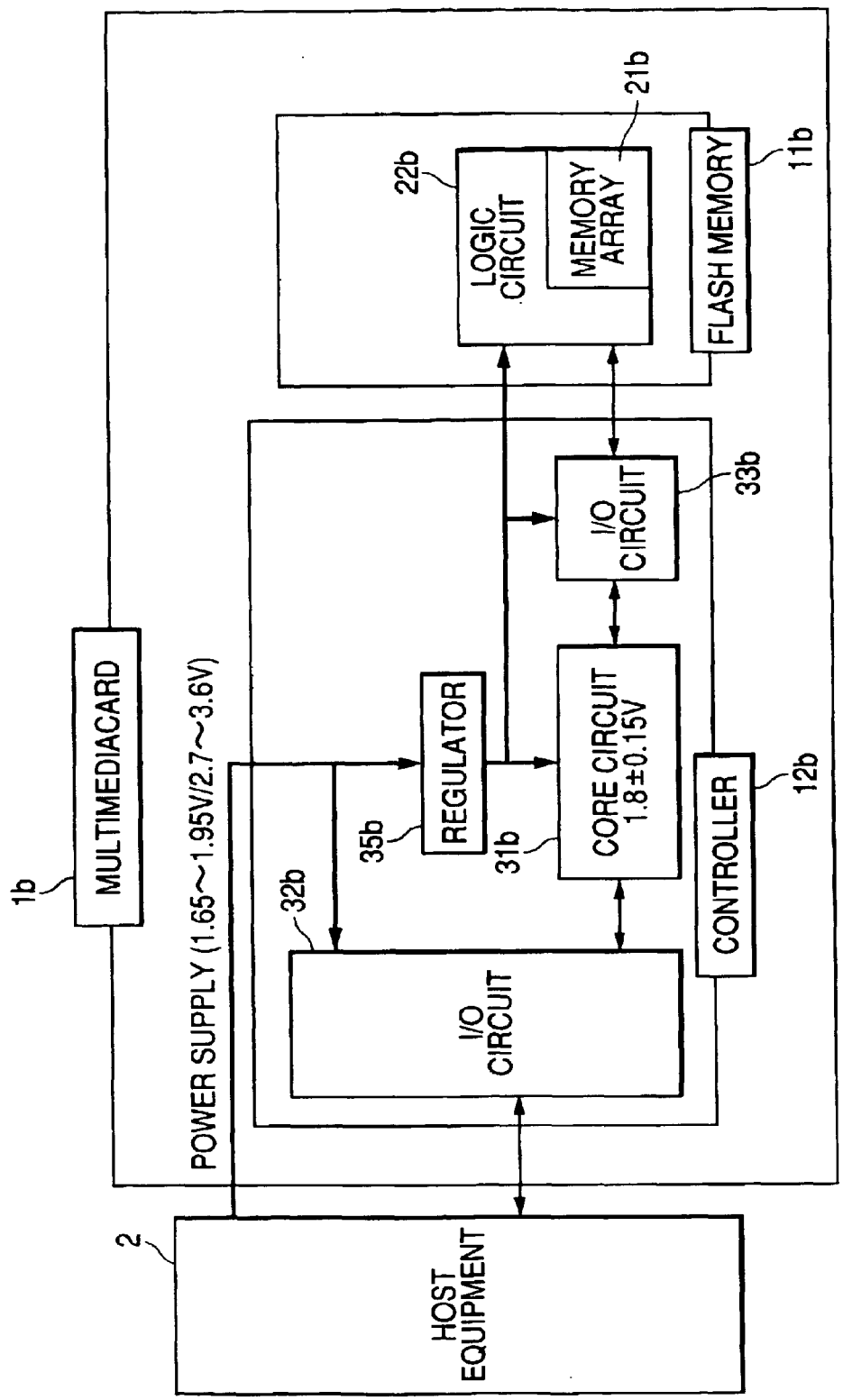
FIG. 9 is a schematic diagram illustrating a system using a further memory card in an embodiment of the present invention.

Next, referring to FIG. 8 and FIG. 9, description will be given to examples of the configuration of systems using other memory cards in this embodiment. FIG. 8 and FIG. 9 are schematic diagrams of the systems using other memory cards.

The system using the memory card illustrated in FIG. 8 is constituted as a system using MultiMediaCard like the system illustrated in FIG. 1. A difference from the system in FIG. 1 is that: the I/O circuit (24) of the flash memory 11*a* and the voltage detection circuit (34) of the controller 12*a* are removed. Thus, the system is constituted so that the core circuit 31*a* of the controller 12*a* is caused to operate on the 1.3V-system voltage.

With this constitution, the regulator 35*a* of the controller 12*a* includes a reference voltage generation circuit. Thus, even when the 1.8V-system voltage or 3.3V-system voltage is supplied from the host equipment 2, 1.3V-system voltage can be supplied to the core circuit 31*a* to operate the core circuit 31*a*. This is done by lowering the supply voltage to the 1.3V-system voltage in correspondence with the supply voltage, 1.8V-system or 3.3V-system based on the reference voltage generated by the reference voltage generation circuit. The level shifters in the I/O circuits 32*a* and 33*a* of the controller 12*a* are operated depending on the supply voltage: when the 1.8V-system voltage is supplied, they are not driven. When the 3.3V-system voltage is supplied, they are driven.

Further, the regulator 23*a* of the flash memory 11*a* includes a voltage detection circuit. The supply voltage from the host equipment 2 is detected through the voltage detection circuit, and when the supply voltage is at the voltage level of 1.8V system, the regulator 23*a* is not driven. Thereby, the core circuit comprising the memory array 21*a* and the logic circuit 22*a* can be caused to operate in the 1.8V-system operation mode. When the supply voltage is at the voltage level of 3.3V system, the regulator 23*a* is driven to convert the voltage level, and thus, the core circuit can be caused to operate in the 3.3V system operation mode.

The system using the memory card illustrated in FIG. 9 is constituted as a system using MultiMediaCard like the systems illustrated in FIG. 1 and FIG. 8. A difference from the system in FIG. 8 is that: the regulator (23) of the flash memory 11*b* is removed. Thus, the system is constituted so that the flash memory 11*b* is supplied with voltage lowered by the regulator 35*b* of the controller 12*b* and caused to operate on the 1.8V-system voltage. Further, the system is constituted so that the core circuit 31*b* of the controller 12*b* is also caused to operate on the 1.8V-system voltage.

With this constitution, the regulator 35*b* of the controller 12*b* includes a voltage detection circuit. Thus, the supply voltage from the host equipment 2 is detected through the voltage detection circuit, and the following operation can be performed depending on the detected voltage: when the detected voltage is at the voltage level of 1.8V system, the regulator 35*b* is not driven, and the core circuit 31*b* is caused to operate in the 1.8V-system operation mode. When the detected voltage is at the voltage level of 3.3V system, the regulator 35*b* is driven to convert the voltage level, and the core circuit 31*b* is caused to operate in the 3.3V-system operation mode. The level shifters in the I/O circuits 32*b* and 33*b* of the controller 12*b* are operated as follows: at the 1.8V-system voltage, they are not driven, and at the 3.3V-system voltage, they are driven.

Further, the flash memory 11*b* is supplied with voltage at the voltage level of 1.8V system through the regulator 35*b* of the controller 12*b*. Therefore, the core circuit comprising the memory array 21*b* and the logic circuit 22*b* can be operated in the 1.8V-system operation mode.

Figure 10:
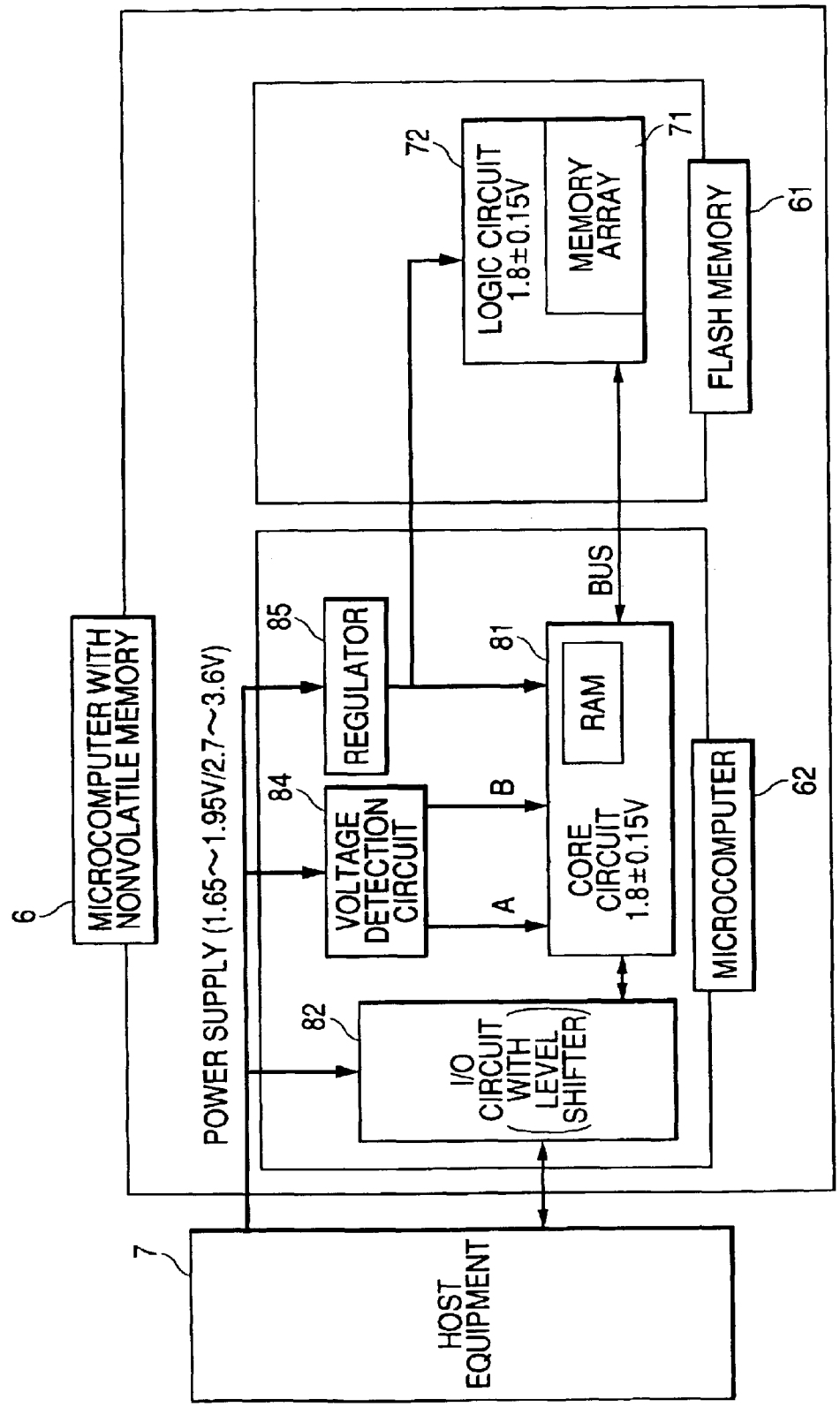
FIG. 10 is a schematic diagram illustrating a system using a microcomputer with nonvolatile memory in an embodiment of the present invention.

Next, referring to FIG. 10, description will be given to an example of the configuration of a system using a microcomputer with nonvolatile memory in an embodiment of the present invention. FIG. 10 is a schematic diagram of the system using the microcomputer with nonvolatile memory.

The system using the microcomputer 6 with nonvolatile memory in this embodiment comprises: the microcomputer 6 with nonvolatile memory; host equipment 7 which is electrically connected with the microcomputer 6 with nonvolatile memory and supplies commands to the microcomputer 6 with nonvolatile memory to control the operation of the microcomputer 6 with nonvolatile memory; and the like. The microcomputer 6 with nonvolatile memory is provided with the same functions as the above-mentioned memory card is. That is, the microcomputer 6 with nonvolatile memory comprises a flash memory 61 for storing varied information; a microcomputer 62 for controlling the operation associated with the flash memory 61; and the like.

The flash memory 61 comprises: a memory array 71 for storing user data, management data, and the like; a logic circuit 72 having the functions of controlling the memory array 71 and performing logical operation related thereto; and the like. The flash memory 61 is supplied with supply voltage through the regulator of the microcomputer 62.

The microcomputer 62 comprises: a core circuit 81 comprising CPU, RAM, and the like; an I/O circuit 82 which is responsible for interface with the host equipment 7 and has the functions of controlling a level shifter provided with turn-on/off function and the like and performing logical operation related thereto, for connection with the host equipment 7; a voltage detection circuit 84 which detects the level of supply voltage supplied from the host equipment 7; a regulator 85 provided with turn-on/off function for converting the voltage level at which the core circuit 81 is caused to operate; and the like.

When the microcomputer 62 built in the thus constituted microcomputer 6 with nonvolatile memory judges the level of supply voltage from the host equipment 7, it operates as follows: after the judgment of excess of detecting point A corresponding to the voltage level of 1.8V system, it judges whether detecting point B corresponding to the voltage level of 3.3V system has been exceeded. When the supply voltage is at the voltage level of 1.8V system, the microcomputer 62 supplies the voltage to the flash memory 61 without driving the regulator 85 or the level shifter. Thus, the flash memory 61 can be operated in the 1.8V-system operation mode. When the supply voltage is at the voltage level of 3.3V system, the microcomputer 62 drives the regulator 85 and the level shifter to convert the voltage level and supplies the voltage to the flash memory 61. Thus, the flash memory 61 can be operated in the 3.3V system operation mode.

Further, the microcomputer 6 with nonvolatile memory is so constituted that: when the supply voltage from the host equipment 7 exceeds detecting point A and then exceeds detecting point B, transition from the 1.8V-system operation mode to the 3.3V-system operation mode can be automatically carried out. When the supply voltage exceeds detecting point B and then drops to detecting point B or below, transition from the 3.3V-system operation mode to the 1.8V-system operation mode can be automatically carried out.

In this embodiment, therefore, a MultiMediaCard 1, 1a, or 1b equipped with a flash memory 11, 11a, or 11b and a controller 12, 12a, or 12b can be operated under two different types of power supply specifications for 1.8V system and 3.3V system. Also, a microcomputer 6 with nonvolatile memory which is a combination of a flash memory 61 and a microcomputer 62 can be operated under the two different types of power supply specifications.

Further, the MultiMediaCard 1, 1a, or 1b can be so constituted that: transition from the 1.8V-system operation mode to the 3.3V system-operation mode is automatically carried out; and transition from the 3.3V-system operation mode to the 1.8V-system operation mode is disabled or enabled according to a command from the host equipment 2.

Further, the microcomputer 6 with nonvolatile memory can be so constituted that: both transition form the 1.8V-system operation mode to the 3.3V-system operation mode and transition from the 3.3V-system operation mode to the 1.8V-system operation mode are automatically carried out.

As an internal register of MultiMediaCard, a resister designated as OCR (Operation Condition Register) is available. The OCR contains information indicating voltages at which the MultiMediaCard is operable. Table 1 lists the details of the OCR.

TABLE 1

| OCR bit | VDD voltage window | High Voltage MultimediaCard | Low Voltage MultimediaCard |
|---|---|---|---|
| [6:0] | Reserved | 0000000b | 0000000b |
| [7] | 1.65–1.95 | 0b | 1b |
| [14:8] | 2.0–2.6 | 0000000b | 0000000b |
| [23:15] | 2.7–3.6 | 111111111b | 111111111b |
| [30:24] | Reserved | 0000000b | 0000000b |
| [31] | Card power up status bit (busy) | | |

Table 20:OCR Register Definition
1) This bit is set to LOW if the card has not finished the power up routine.

The setting of the OCR can be read also by the host equipment connected with the MultiMediaCard. The following can be carried out by acquiring operating voltage information contained in the OCR: the host equipment can learn voltages at which the MultiMediaCard is operable, and can select the level of voltage supplied to the MultiMediaCard.

The host equipment supplies operating voltage of 1.8V system, for example. When the OCR is stored in the flash memory, a problem arises. It will be assumed that the flash memory in the MultiMediaCard is a flash memory whose operation of reading stored data is also destabilized at the operating voltage of 1.8V system. When OCR information read out of such a flash memory is supplied to the host equipment, the host equipment can acquire incorrect operating voltage information. Therefore, it is inappropriate to store OCR information in the flash memory.

Further, in which OCR information should be stored, the flash memory or somewhere else, can be determined according to whether the flash memory in the MultiMediaCard is operable at the operating voltage of 1.8V system. In this case, increase in the number of types of controller in the MultiMediaCard will result, and this can lead to increased manufacturing cost.

To cope with this, the present inventors considered making the MultiMediaCard operable on two different types of power supplies. Further, the present inventors considered appropriately supplying OCR information to host equipment even when the MultiMediaCard is so constituted that it is operable on only one type of power supply.

Figure 11:
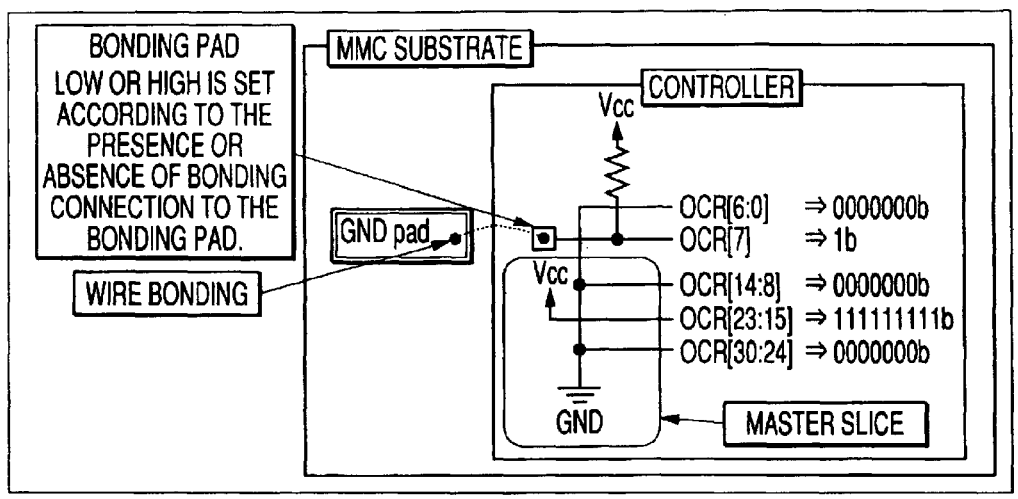
FIG. 11 is a schematic diagram illustrating a case where OCR setting is carried out by bonding pad in an embodiment of the present invention.

FIG. 11 illustrates an embodiment with respect to the setting of OCR information. Of the bits of OCR listed in Table 1, that which must be set as information indicating operating voltage is only the seventh bit, and the settings of the other bits are fixed. For this reason, whether the entire MultiMediaCard is operable on the operating voltage of 1.8V system can be set by providing a bonding pad for setting the seventh bit. When the bonding pad is connected with grounded power supply, the seventh bit is set to logical "0." When the bonding pad is open or connected with operating power supply, the seventh bit is set to logical "1."

Figure 12:
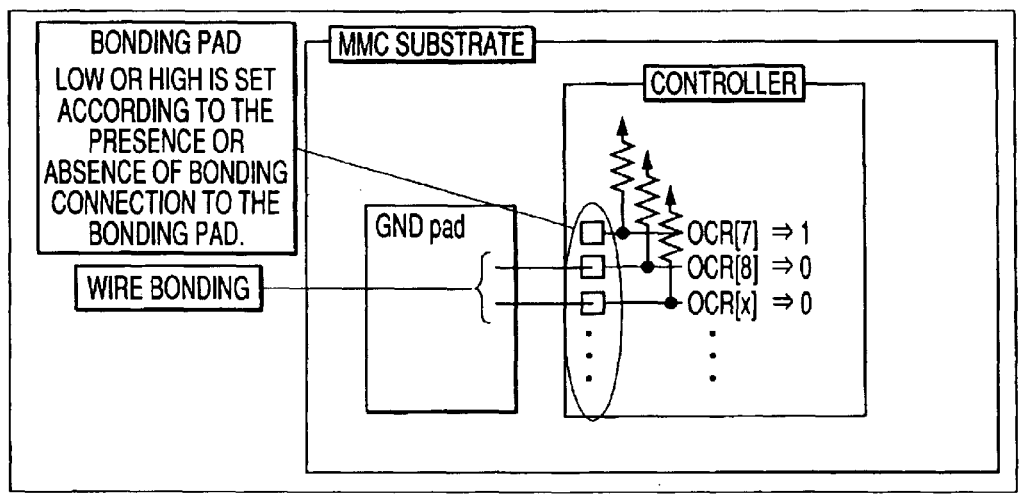
FIG. 12 is another schematic diagram illustrating a case where OCR setting is carried out by bonding pad in an embodiment of the present invention.

If the possibility that the other bits of OCR will require setting in the future is considered, the other bits may also be settable by bonding pad, as illustrated in FIG. 12.

Figure 13:
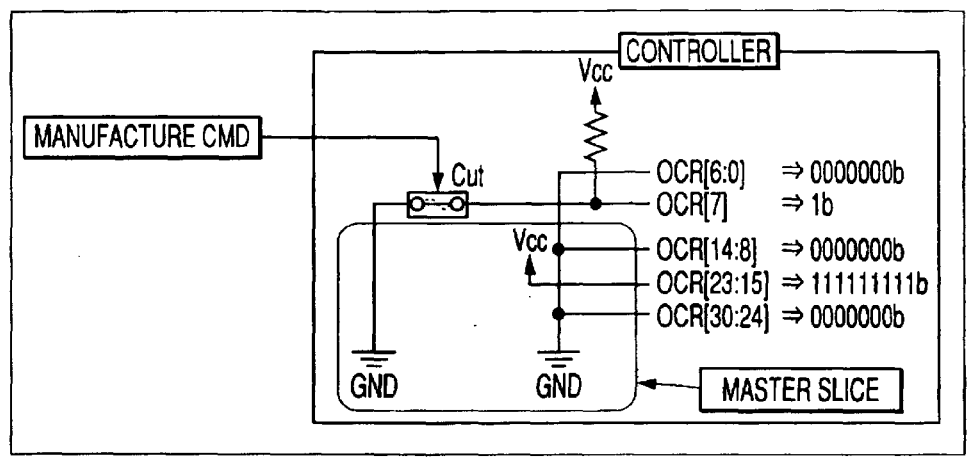
FIG. 13 is a schematic diagram illustrating a case where OCR setting is carried out by fuse in an embodiment of the present invention.

FIG. 13 illustrates another embodiment with respect to the setting of OCR information. In this embodiment, a fuse is provided for setting the seventh bit. When the fuse is electrically connected, connection with grounded power supply is provided, and the seventh bit is set to logical "0." When the fuse is electrically disconnected, connection with operating power supply is provided, and the seventh bit is set to logical "1." Thereby, whether the entire MultiMediaCard is operable on the operating voltage of 1.8V system can be set.

Figure 14:
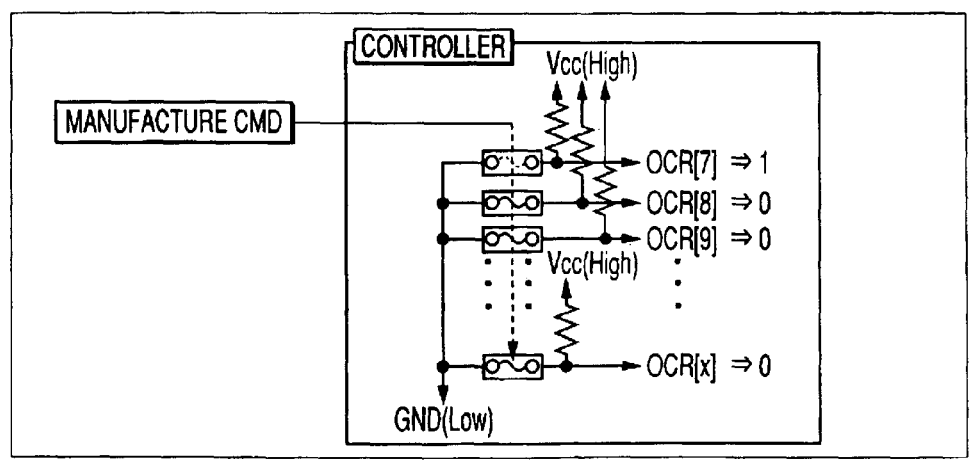
FIG. 14 is another schematic diagram illustrating a case where OCR setting is carried out by fuse in an embodiment of the present invention.

As in FIG. 12, needless to add, the other bits of OCR may also be settable by connection with either grounded power supply or operating power supply through fuses, as illustrated in FIG. 14. As a constitution using fuse, various fuses can be used. Examples include a laser fuse to be cut off by laser and a flash fuse using nonvolatile memory.

Needless to add, the connecting potential of bonding pads and the setting of connection/disconnection of fuses vary depending on whether they are pulled up or pulled down to operating power supply, as illustrated in the figure.

As mentioned above, the setting of OCR information can be made by bonding pad or fuse. Thus, the controller can be set according to the operating voltage of a flash memory connected. As a result, it becomes possible to reduce increase in the number of types of controller and increase in management cost.

Up to this point, the invention made by the present inventors has been specifically described based on the embodiments. However, the present invention is not limited to the above embodiments, and, needless to add, it can be modified in various manners to the extent that the scope of the invention is not departed from.

Some examples will be taken. With respect to the above embodiments, description has been given with a flash memory taken as an example of nonvolatile memory. However, the present invention can be applied to such a nonvolatile memory as EEPROM.

As mentioned above, the present invention is effectively applied to MultiMediaCard equipped with flash memory. Further, the present invention is widely applicable to memory cards according to other standards and semiconductor devices in general, including memory devices. Especially, the present invention can be favorably applied to memory cards and semiconductor devices which are caused to operate on two different types of power supplies.

Further, with respect to the above embodiments, description has been given to two operation modes, 1.8V-system operation mode and 3.3V-system operation mode. However, the present invention is applicable to memory cards and semiconductor devices which are further provided with, for example, the 1.2V-system operation mode. When the supply voltage of 1.2V system is supplied in this case, the regulators are stopped or bypassed, and when the supply voltage of 1.8V system or 3.3V system is supplied, the regulators are actuated. Thus, voltage of 1.2V system can be supplied to the core circuit 31 and the like.

Alternatively, a regulator for increasing voltage and a regulator for lowering voltage may be provided. When the supply voltage of 1.8V system is supplied, the regulators are stopped or bypassed. When the supply voltage of 1.2V system is supplied, the regulator for increasing voltage is actuated. When the supply voltage of 3.3V system is supplied, the regulator for lowering voltage is actuated. Thus, a voltage of 1.8V can be supplied to the core circuit 31 and the like.

In the flash memory in the above embodiments, the supply voltage of 3.3V system is lowered to the supply voltage of 1.8V system by the regulators, and then supplied to the core circuit. However, the present invention may be further provided with a regulator for increasing voltage which generates as high voltage as 10V or so used in the operation of writing into memory cells contained in the memory array 21 or erasing therefrom.

What is claimed is:

1. A memory card comprising:

a nonvolatile memory;

a controller which controls operations associated with said nonvolatile memory; and a converter which converts a level of a supply voltage to an internal voltage level depending upon an operation mode of said nonvolatile memory, wherein said controller is capable of selecting one of a first operation mode in which said nonvolatile memory is supplied with a voltage in a first range and a second operation mode in which said nonvolatile memory is supplied with a voltage in a second range higher than said first range, and wherein said controller performs the following operations: said controller judges whether said level of said supply voltage is higher than a first detection voltage level corresponding to said first range; after the judgment of said level of said supply voltage, said controller further judges whether said level of said supply voltage is higher than a second detection voltage level corresponding to said second range; when said supply level is in said first range, said controller causes said nonvolatile memory to operate in said first operation mode without driving said converter; and when said supply voltage is in said second range, said controller drives said converter to convert said level and of said supply voltage to said internal voltage level causes said nonvolatile memory to operate in said second operation mode.

2. The memory card according to claim 1, wherein said controller has information indicating that said memory card thereof is operable at either or both of said first range and said second range.

3. The memory card according to claim 1, wherein said controller carries out transition from said first operation mode to said second operation mode and disables transition from said second operation mode to said first operation mode.

4. The memory card according to claim 1, wherein said controller carries out transition from said first operation mode to said second operation mode and enables transition from said second operation mode to said first operation mode when said controller receives a transition instruction from outside.

5. The memory card according to claim 1, wherein said first range includes a level of 1.8V, and said second range includes a level of 3.3V.

6. A microcomputer with nonvolatile memory comprising:

a nonvolatile memory;

a microcomputer which controls operations associated with said nonvolatile memory; and a converter which converts a level of a supply voltage to an internal voltage level depending upon an operation mode of said nonvolatile memory, wherein said converter is capable of selecting one of a first operation mode in which said nonvolatile memory is supplied with at a voltage and in a first range and a second operation mode in which said nonvolatile memory is supplied with a voltage in a second range higher than said first range, and wherein said microcomputer performs the following operations: said microcomputer judges whether said level of said supply voltage has reached a first detection voltage has corresponding to said first range; after the judgment of, said level of said supply voltage, said microcomputer further judges whether said level of said supply voltage has reached a second detection voltage corresponding to said second range; when said level of said supply voltage is within said first range, said microcomputer causes said nonvolatile memory to operate in said first operation mode without driving said converter; and when said supply level of voltage is within said second range, said microcomputer drives said converter to convert said level of said supply voltage to said internal voltage level and causes said nonvolatile memory to operate in said second operation mode.

7. The microcomputer with nonvolatile memory according to claim 6, wherein said microcomputer has information indicating said microcomputer with nonvolatile memory is operable in either or both of said first range and said second range.

8. The microcomputer with nonvolatile memory according to claim 6, wherein said microcomputer carries out transition from said first operation mode to said second operation mode and transition from said second operation mode to said first operation mode.

9. The microcomputer with nonvolatile memory according to claim 6, wherein said first range includes a level of 1.8V and said second range includes a level of 3.3V.

* * * * *